US009496397B2

United States Patent
Ching et al.

(10) Patent No.: US 9,496,397 B2
(45) Date of Patent: Nov. 15, 2016

(54) FINFET DEVICE WITH CHANNEL EPITAXIAL REGION

(71) Applicant: Taiwan Semiconductor Manufacturing Co., Ltd., Hsin-Chu (TW)

(72) Inventors: Kuo-Cheng Ching, Zhubei (TW); Zhi-Chang Lin, Zhubei (TW); Chao-Hsiung Wang, Hsin-Chu (TW); Chi-Wen Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/970,790

(22) Filed: Aug. 20, 2013

(65) Prior Publication Data

US 2015/0054039 A1    Feb. 26, 2015

(51) Int. Cl.
| | | |
|---|---|---|
| H01L 29/78 | (2006.01) | |
| H01L 21/76 | (2006.01) | |
| H01L 29/66 | (2006.01) | |
| H01L 21/762 | (2006.01) | |

(52) U.S. Cl.
CPC ............ *H01L 29/785* (2013.01); *H01L 21/76* (2013.01); *H01L 21/76229* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 7,154,118 B2 | 12/2006 | Lindert et al. | |
| 7,193,279 B2 | 3/2007 | Doyle et al. | |
| 8,362,572 B2 | 1/2013 | Huang et al. | |
| 2006/0076625 A1* | 4/2006 | Lee ................... | H01L 29/7851 257/353 |
| 2007/0120156 A1 | 5/2007 | Liu et al. | |

(Continued)

OTHER PUBLICATIONS

U.S. Appl. No. 13/952,753, filed Jul. 29, 2013. 36 Pages.

(Continued)

*Primary Examiner* — Yu Chen
*Assistant Examiner* — Nilufa Rahim
(74) *Attorney, Agent, or Firm* — Eschweiler & Associates, LLC (57) ABSTRACT

The present disclosure relates to a Fin field effect transistor (FinFET) device having epitaxial enhancement structures, and an associated method of fabrication. In some embodiments, the FinFET device has a semiconductor substrate having a plurality of isolation regions overlying the semiconductor substrate. A plurality of three-dimensional fins protrude from a top surface of the semiconductor substrate at locations between the plurality of isolation regions. Respective three-dimensional fins have an epitaxial enhancement structure that introduces a strain into the three-dimensional fin. The epitaxial enhancement structures are disposed over a semiconductor material within the three-dimensional fin at a position that is more than 10 nanometers above a bottom of an adjacent isolation region. Forming the epitaxial enhancement structure at such a position provides for sufficient structural support to avoid isolation region collapse.

19 Claims, 5 Drawing Sheets

(56) References Cited

U.S. PATENT DOCUMENTS

| | | |
|---|---|---|
| 2007/0267695 A1 | 11/2007 | Lee |
| 2009/0278196 A1 | 11/2009 | Chang et al. |
| 2010/0163971 A1 | 7/2010 | Hung et al. |
| 2012/0241818 A1 | 9/2012 | Kavalieros et al. |
| 2012/0319211 A1* | 12/2012 | Van Dal et al. ............. 257/401 |
| 2013/0075797 A1* | 3/2013 | Okano .............. H01L 29/66795 257/288 |
| 2014/0011341 A1* | 1/2014 | Maszara et al. ............. 438/478 |
| 2014/0357029 A1* | 12/2014 | Loubet et al. ................ 438/221 |
| 2015/0024573 A1* | 1/2015 | Jacob et al. .................. 438/424 |

OTHER PUBLICATIONS

English Translation of Korean Office Action dated Dec. 18, 2014 for co-pending Korean Application No. 10-2013-0155659.

Non Final Office Action Dated Apr. 27, 2015 U.S. Appl. No. 13/952,753.

English translation of Korean Action dated Oct. 15, 2015 for co-pending Korean Application No. 10-2013-0155659.

Notice of Allowance Dated Jul. 17, 2015 U.S. Appl. No. 13/952,753.

* cited by examiner

FINFET DEVICE WITH CHANNEL EPITAXIAL REGION

BACKGROUND

As integrated chips continue to decrease in size, limitations in processing capabilities and in fundamental material characteristics have made scaling of planar CMOS transistors increasingly difficult (e.g., due to leakage current and process variations). FinFET (Field effect transistors) devices have long been looked to as a promising alternative to planar CMOS transistors. In recent years, advances in processing technology have made FinFET devices a viable option in emerging technologies (e.g., 22 nm and below).

FinFET devices are three-dimensional structures that have a conducting channel comprising a fin of semiconducting material that rises above a planar substrate as a three-dimensional structure. A gate structure, configured to control the flow of charge carriers within the conducting channel, wraps around the fin of semiconducting material. For example, in a tri-gate FinFET structure, the gate structure wraps around three sides of the fin of semiconducting material, thereby forming conductive channels on three sides of the fin.

BRIEF DESCRIPTION OF THE DRAWINGS

FIGS. 6A-9B illustrates some embodiments of FinFET devices having epitaxial enhancement structures disposed within a three-dimensional fin at varying positions.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather include non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

In recent years, strain engineering has been used as a means to increase the performance of semiconductor devices. Strain engineering introduces a strain into material within a channel region of a semiconductor device to improve the performance of the device. Strain is often induced by forming one or more stress materials around the channel region. For example, a lattice mismatch material can provide stress on the channel region. Such a lattice mismatch can be formed by depositing a layer of silicon over layer of silicon germanium. The atoms in the silicon layer align with the atoms of the underlying silicon germanium layer (which are arranged further apart), stretching the silicon material. The stretched silicon material reduces interfere with the movement of charge carriers, thereby improving mobility within the channel region.

In FinFET devices, strain engineering may be performed by depositing an epitaxial layer (e.g., a germanium layer) prior to forming depositing a silicon layer that forms a three-dimensional fin having a channel region. It has been appreciated that the position of the epitaxial layer can lead to errors in the fabrication of an overlying three-dimensional fin. For example, if the epitaxial layer is formed at a position that is too low, it can lead to isolation region collapse during subsequent processing steps (for example, during a spin dry process). Alternatively, if the epitaxial layer is formed at a position that is too high, it can limit the height of the three-dimensional fin.

Accordingly, the present disclosure relates to a Fin field effect transistor (FinFET) device having epitaxial enhancement structures, and an associated method of fabrication. The FinFET device comprises a plurality of isolation regions overlying a semiconductor substrate. A plurality of three-dimensional fins protrudes from a top surface of the semiconductor substrate at locations between the plurality of isolation regions. Respective three-dimensional fins comprise an epitaxial enhancement structure configured to introduce a strain into the three-dimensional fin. The epitaxial enhancement structures are disposed within the three-dimensional fin at a position that is more than 10 nanometers above a bottom of an adjacent isolation region. Forming the epitaxial enhancement structure at such a position provides for sufficient structural support to avoid isolation region collapse during subsequent processing steps.

Figure 1A:
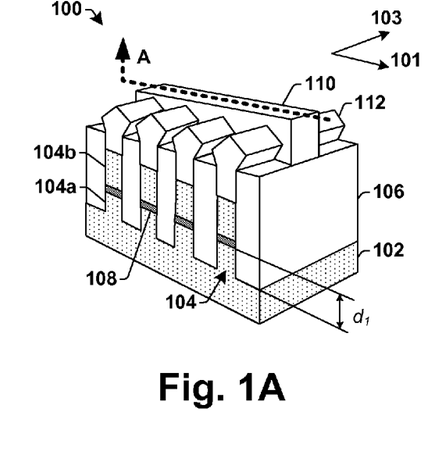
FIGS. 1A-1B illustrates some embodiments of a FinFET device having a buried epitaxial enhancement structure.
Figure 1B:
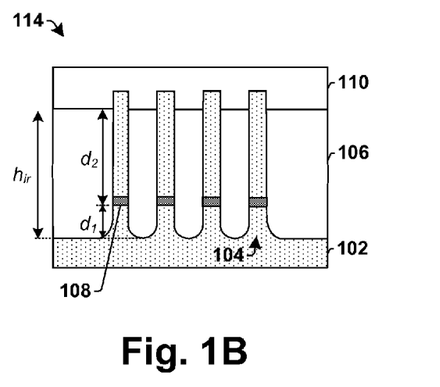

FIGS. 1A-1B illustrates some embodiments of a FinFET device having a buried epitaxial enhancement structure 108.

FIG. 1A illustrates a three-dimensional view 100 of the FinFET device.

As shown in three-dimensional view 100, the FinFET device 100 comprises a planar substrate 102. A plurality of three-dimensional fins 104 are located over the planar substrate 102. In some embodiments, the three-dimensional fins 104 comprise one or more semiconductor materials, which protrude outward from the planar substrate 102 as positive reliefs. The plurality of three-dimensional fins 104 are separated by isolation regions 106 comprising sections of dielectric material along a first direction 101. The isolation regions 106 have a substantially equal height (i.e., the isolation regions 106 extend into the planar substrate 102 to a same depth). The three-dimensional fins 104 extend between source and drain regions 112 along a second direction 103, perpendicular to the first direction 101.

Epitaxial enhancement structures 108 are disposed within the three-dimensional fins 104. The epitaxial enhancement structures 108 are located above a first portion of the three-dimensional fin 104a. In some embodiments, the epitaxial enhancement structures 108 may be further positioned below a second portion of the three-dimensional fin 104b. The epitaxial enhancement structures 108 are configured to induce a tensile strain to the three-dimensional fins 104, which improves device performance. For example, the epitaxial enhancement structures 108 may have a lattice mismatch with the overlying second portion of the three-dimensional fin 104b, which induces a strain into the second portion of the three-dimensional fin 104b. In various embodiments, the epitaxial enhancement structures 108 may comprise silicon germanium (SiGe) or germanium and the first and second portions of the three-dimensional fin, 104a and 104b, may comprise silicon, for example.

The epitaxial enhancement structures 108 are located within the three-dimensional fins 104 at a position that prevents collapsing of the isolation regions 106 during subsequent processing (for example, during a spin dry process). For example, the first portion of the three-dimensional fin 104a provides structural support to the isolation regions 106. As a height of the first portion of the three-dimensional fin 104a increases, the amount of structural support increases, thereby preventing the isolation regions 106 from toppling over during fabrication processes. In some embodiments, the epitaxial enhancement structures 108 may be positioned within the three-dimensional fins 104 at a position that is a distance $d_1$ above the planar substrate 102. In some embodiments, the distance $d_1$ is more than 8% of the height of the isolation regions 106. For example, for isolation regions 106 having a height of 120 nm, the epitaxial enhancement structures 108 may be positioned within the three-dimensional fins 104 at a position that is a distance $d_1$ of more than 10 nanometers over a top surface of the planar substrate 102.

A gate structure 110 is disposed over the planar substrate 102 at a position that straddles the three-dimensional fins 104. The gate structure 110 is configured to control the flow of charge carriers within the three-dimensional fins 104. The gate structure 110 may comprises a gate dielectric layer and an overlying gate material, separated from the three-dimensional fins 104 by the gate dielectric layer. In various embodiments, the gate dielectric layer may comprise a silicon dioxide (e.g., $SiO_2$) layer or a high-k dielectric layer. In various embodiments, the gate material may comprise a poly-silicon layer or a metal gate layer (e.g., aluminum, aluminum oxide, etc.). In some embodiments, sidewalls spacers (not shown) may be located on opposing sides of the gate structure 110.

FIG. 1B illustrates a cross-sectional view 114 of the FinFET device shown in three-dimensional view 100 along a first cross-sectional line A. As shown in cross-sectional view 114, the epitaxial enhancement structure 108 is located within the three-dimensional fins 104 at a position between the isolation regions 106 (e.g., sections of dielectric material).

In some embodiments, corresponding to a 10-14 nm processing node, the isolation regions 106 have a height $h_{ir}$ that is between approximately 80 nm and approximately 120 nm. The epitaxial enhancement structure 108 may be located at a distance $d_1$ that is between approximately 10 nm and approximately 80 nm above a bottom of the isolation regions 106 (i.e., above the planar substrate 102). The distance $d_2$ between the top of the isolation regions 106 and the bottom of the epitaxial enhancement regions 108 may be between approximately 40 nm and approximately 110 nm.

Figure 2A:
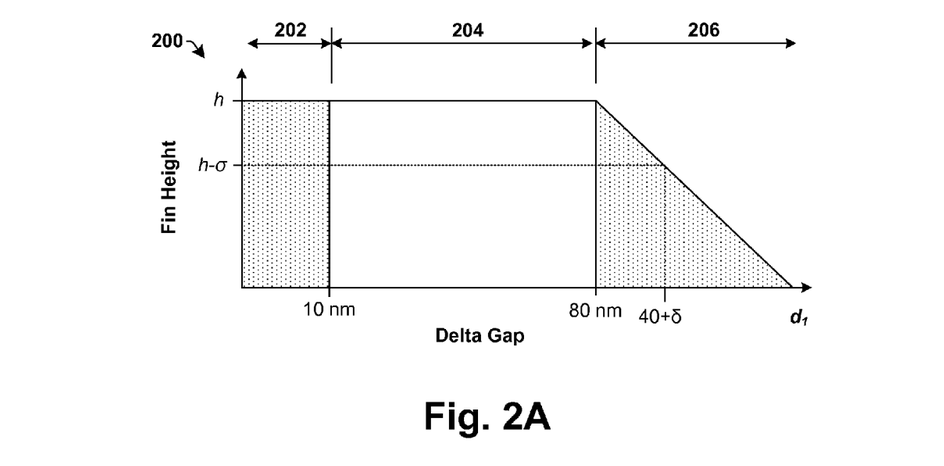
FIG. 2A illustrates some embodiments of a graph showing acceptable positions of epitaxial enhancement structures that mitigate isolation region collapse during fabrication of a FinFET.
Figure 2B:
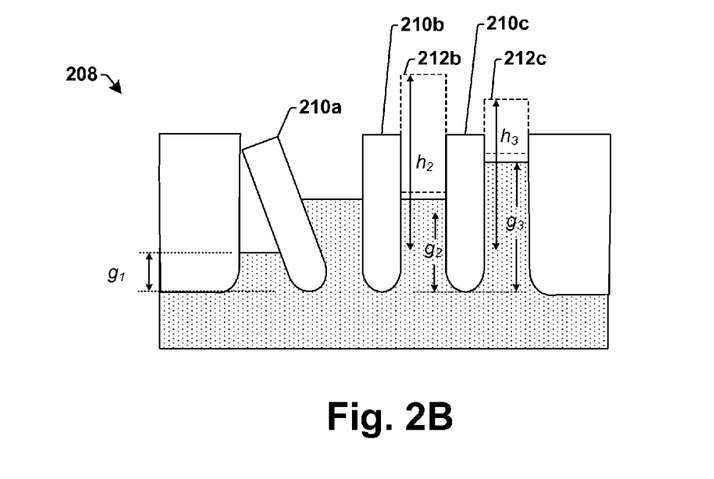
FIG. 2B illustrates some embodiments of a FinFET device having varying gap sizes corresponding to the graph of FIG. 2A.

FIG. 2A illustrates a graph 200 showing acceptable positions of epitaxial enhancement structures that mitigate isolation region collapse during fabrication of a FinFET device. The graph 200 illustrates a height of a three-dimensional fin (y-axis) as a function of a size of the distance $d_1$ (x-axis) for a 10-14 nm processing node. It will be appreciated that the values expressed within the graph 200 are not limiting and that for other processing nodes (e.g., a 7 nm process node, a 22 nm processing node) the values my vary. FIG. 2B illustrates a cross-sectional view 208 of a semiconductor substrate illustrating trenches extending to various positions over a top surface of a planar substrate 102 (e.g., a silicon wafer).

As shown in graph 200, within a first region 202 corresponding to a distance $d_1$ of between approximately 0 nm and approximately 10 nm, isolation regions 106 will collapse due to the energy of subsequent processing steps. This is because the relatively small distance $d_1$ results in the isolation regions being embedded within a shallow layer of semiconductor material that provides a structural support that may be overcome by the energy of subsequent processing steps.

For example, as shown in cross-sectional view 208, isolation region 210a is positioned adjacent to a gap filled with a semiconductor material to a height of $g_1$, wherein $g_1$ is less than 10 nm. During subsequent processing steps, the energy of the processing steps causes the isolation region 210a to topple over.

Within a second region 204, corresponding to a distance $d_1$ of between approximately 10 nm and approximately 80 nm, isolation regions will not collapse during subsequent processing. This is because the distance $d_1$ results in the isolation regions being embedded within a layer of semiconductor material that provides a structural support that is not overcome by the energy of subsequent processing steps. Furthermore, within the second region 204, the height of a three-dimensional fin is not negatively impacted. Rather, a three-dimensional fin can be formed to a full height.

For example, as shown in cross-sectional view 208, isolation region 210b is positioned between gap filled with a semiconductor material to a height of $g_2$, wherein $g_2$ is between approximately 10 nm and approximately 80 nm. During subsequent processing steps, the energy of the processing steps is insufficient to cause the isolation region 210b to topple over. Furthermore, a three-dimensional fin 212b associated with the gap can be subsequently formed to a full height of $h_2$.

Within a third region 206 corresponding to a distance $d_1$ of greater than 80 nm, isolation regions will not collapse during subsequent processing. This is because the distance $d_1$ results in the isolation regions being embedded within a layer of semiconductor material that provides a structural support that is not overcome by the energy of subsequent processing steps. However, as shown in graph 200, as the distance $d_3$ increases, the height of a corresponding fin is negatively impacted. For example, at a distance of 80 nm+δ, the corresponding three-dimensional fin height will be reduced from a height of h to a height of h−σ. The reduction in the height of the corresponding three-dimensional fin has an adverse effect on device performance.

For example, as shown in cross-sectional view 208, isolation region 210c is positioned adjacent to a gap filled with a semiconductor material to a height of $g_3$, wherein $g_3$ is greater than approximately 80 nm. The height of the semiconductor material limits the height of a corresponding fin to a height of $h_3 < h_2$.

Figure 3A:
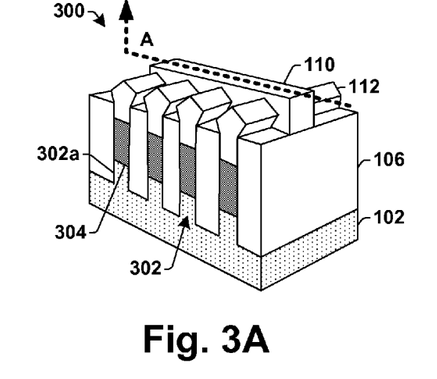
FIGS. 3A-3B illustrates some alternative embodiments of a FinFET device having an epitaxial enhancement structure.
Figure 3B:
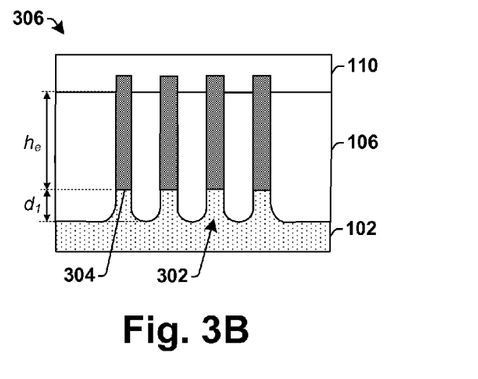

FIGS. 3A-3B illustrates some alternative embodiments of a FinFET device having an epitaxial enhancement structure 304.

FIG. 3A illustrates a three-dimensional view 300 of the FinFET device. As shown in three-dimensional view 300, the epitaxial enhancement structure 304 is located above a first portion of the three-dimensional fin 302a. The epitaxial enhancement structure 304 extends from a position within the three-dimensional-fin 302 that is a distance $d_1$ above the planar substrate 102 to a top of the fin.

FIG. 3B illustrates a cross-sectional view 306 of a FinFET device shown in three-dimensional view 300 along a first cross-sectional line A. As shown in cross-sectional view 306, the epitaxial enhancement structure 304 is located within the three-dimensional fins 302 at a position between the isolation regions 106. In some embodiments, the epitaxial enhancement structure 304 may be located at a distance $d_1$ that is between approximately 10 nm and approximately 80 nm over the planar substrate 102. The epitaxial enhancement structure 304 have a height $h_e$ that may be between approximately 40 nm and approximately 110 nm.

Figure 4A:
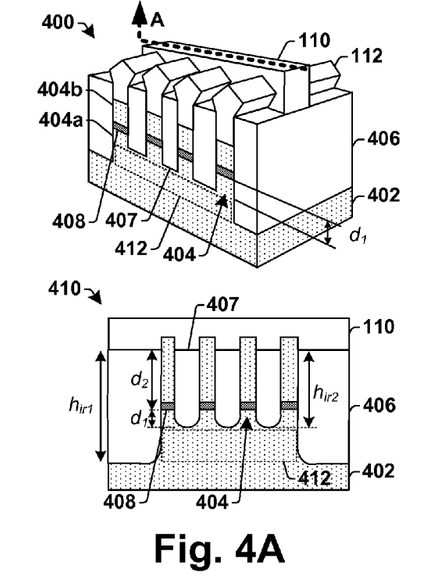
FIGS. 4A-4B illustrates some embodiments of a FinFET device having a buried epitaxial enhancement structure located above a crown structure.

FIG. 4A illustrates some embodiments of a FinFET device having an epitaxial enhancement structure 408 located above a crown structure.

FIG. 4A illustrates a three-dimensional view 400 of the FinFET device. The FinFET device comprises a semiconductor substrate 402. The semiconductor substrate 402 comprises a crown structure 412 comprising a plateau of semiconductor material extending outward from a planar surface of the semiconductor substrate 402. The crown structure 412 causes the substrate to have peripheral isolation regions 406 that extend to a first depth and internal isolation regions 407, located above the crown structure 412, which extend to a second depth less than the first depth.

A plurality of three-dimensional fins 404 are located over the crown structure 412. In some embodiments, the three-dimensional fins 404 comprise one or more semiconductor materials, which protrude outward from the semiconductor substrate 402 as a positive relief. The three-dimensional fins 404 extend between source and drain regions 112.

Epitaxial enhancement structures 408 are disposed within the three-dimensional fins 404. The epitaxial enhancement structures 408 are located above a first portion of the three-dimensional fin 404a. In some embodiments, the epitaxial enhancement structures 408 may be further positioned below a second portion of the three-dimensional fin 404b. The epitaxial enhancement structures 408 are configured to induce a tensile strain to the three-dimensional fins 404, which improves device performance. In various embodiments, the epitaxial enhancement structures 408 may comprise silicon germanium (SiGe) or germanium and the first and second portions of the three-dimensional fin, 404a and 404b, may comprise silicon, for example.

The epitaxial enhancement structures 408 are located within the three-dimensional fins at positions that provide structural support to the isolation regions, 406 and 407, and prevents collapsing of the isolation region 407 during subsequent processing. In some embodiments, the epitaxial enhancement structures 408 may be positioned within the three-dimensional fins 404 at a position that is a distance $d_1$ above the planar substrate 102. In some embodiments, the distance $d_1$ is more than 8% of the height of the peripheral isolation regions 406 and 12% of the internal isolation regions 407. For example, for isolation regions 406 having a height of 120 nm and isolation regions 407 having a height of 80 nm, the epitaxial enhancement structures 408 may be positioned within the three-dimensional fins 104 at a position that is a distance $d_1$ of more than 10 nanometers over a top surface of the crown structure 412.

A gate structure 110, comprising a three-dimensional structure, is disposed over the semiconductor substrate 402 at a position that straddles the three-dimensional fins 104. The gate structure 110 is configured to control the flow of charge carriers within the three-dimensional fins 104.

FIG. 4A further illustrates a cross-sectional view 410 of the FinFET device shown in three-dimensional view 400 along a first cross-sectional line A. As shown in cross-sectional view 410, the epitaxial enhancement structures 408 are located within the three-dimensional fins 404 at a position between the isolation regions 406 and 407.

In some embodiments, corresponding to a 10-14 nm processing node, the peripheral isolation regions 406 have a height $h_{ir1}$ that is between approximately 60 nm and approximately 120 nm. The internal isolation regions 407 have a height $h_{ir2}$ that is between approximately 40 nm and approximately 80 nm. The epitaxial enhancement structure 408 may be located at a distance $d_1$ that is between approximately 10 nm and approximately 40 nm above a bottom of the internal isolation regions 407 (i.e., above the crown structure 412). A distance $d_2$ between the top of the isolation regions, 406 and 407, and the bottom of the epitaxial enhancement structures 408 may be between approximately 40 nm and approximately 110 nm.

Figure 4B:
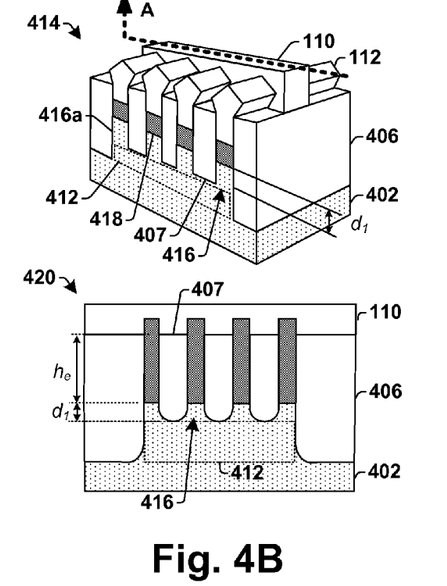

FIG. 4B illustrates some alternative embodiments of a FinFET device having an epitaxial enhancement structure 418.

FIG. 4B illustrates a three-dimensional 414 of the FinFET device. As shown in three-dimensional view 414, the epitaxial enhancement structure 418 is located above a first portion of the three-dimensional fin 416a. The epitaxial enhancement structure 418 extends from a position within the three-dimensional fin 416 to a top of the fin. The epitaxial enhancement structures 418 are located within the three-dimensional fins 416 at a position that is a distance $d_1$ above a bottom of the internal isolation regions 407 (i.e., above the crown structure 412)

FIG. 4B illustrates a cross-sectional view 420 of the FinFET device shown in three-dimensional view 414 along a first cross-sectional line A. As shown in cross-sectional view 420, the epitaxial enhancement structure 418 is located within the three-dimensional fins 416 at a position between the isolation regions, 406 and 407. In some embodiments, the epitaxial enhancement structure 418 may be located at a distance $d_1$ that is between approximately 10 nm and approximately 40 nm above a bottom of the internal isolation regions 407 (i.e., above the crown structure 412). The epitaxial enhancement structure 418 have a height $h_e$ that may be between approximately 40 nm and approximately 110 nm.

Figure 5:
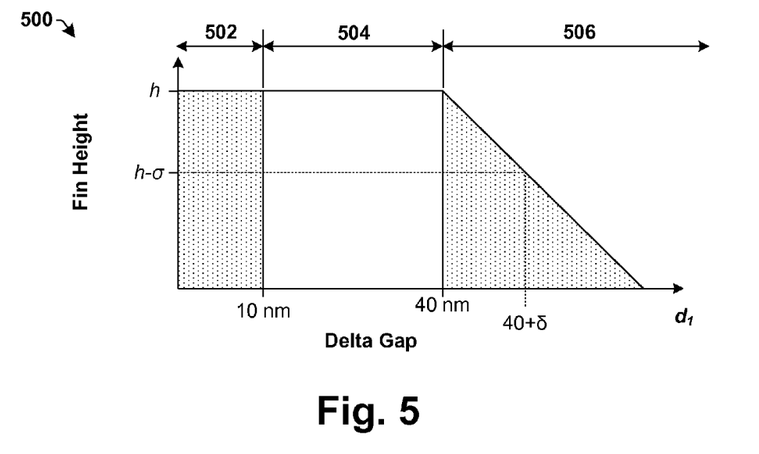
FIG. 5 illustrates some embodiments of a graph showing acceptable positions of epitaxial enhancement structures that mitigate isolation region collapse during fabrication of a FinFET device with a crown structure.

FIG. 5 illustrates a graph 500 showing some embodiments of acceptable positions of epitaxial enhancement structures that mitigate isolation region collapse during fabrication of a FinFET device with a crown structure. The graph illustrates a height of a three-dimensional fin (y-axis) as a function of a size of the distance $d_1$ (x-axis).

As shown in graph 500, within a first region 502 corresponding to a distance $d_1$ of between 0 nm and approximately 10 nm, the isolation regions will collapse due to the energy of subsequent processing steps. This is because the relatively small distance $d_1$ results in the isolation regions being embedded within a shallow layer of semiconductor material that provides a structural support that may be overcome by the energy of subsequent processing steps.

Within a second region 504 corresponding to a distance $d_1$ of between approximately 10 nm and approximately 40 nm, the isolation regions will not collapse during subsequent processing. This is because the distance $d_1$ results in the isolation regions being embedded within a layer of semiconductor material that provides a structural support that is not overcome by the energy of subsequent processing steps. Furthermore, within the second region 504, the height of a three-dimensional fin is not negatively impacted. Rather, a three-dimensional fin can be formed to a full height.

Within a third region 506 corresponding to a distance $d_1$ of greater than 40 nm, the isolation regions will not collapse during subsequent processing since the energy of subsequent fabrication processes is insufficient to overcome the structural support provided by the semiconductor material. However, as shown in graph 500, as the distance $d_1$ increases, the height of a corresponding fin is negatively impacted. For example, at a distance of 40 nm+δ, the corresponding three-dimensional fin height will be reduced from a height of h to a height of h−σ. The reduction in the height of the corresponding three-dimensional fin has an adverse effect on device performance.

In some embodiments, the size of the distance between an epitaxial enhancement structure and a bottom of an adjacent isolation region (i.e., an underlying substrate) may vary between adjacent three-dimensional fins. FIGS. 6A-9B illustrates various embodiments of semiconductor substrates having varying distances.

Figure 6A:
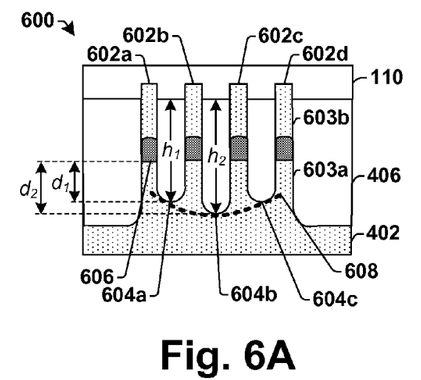

FIG. 6A illustrates some embodiments of a cross-sectional view 600 of a FinFET device having epitaxial enhancement structures 606 disposed within three-dimensional fins 602 at varying distances above a crown structure of a semiconductor substrate 402. The epitaxial enhancement structures 606 are located above a first portion of a three-dimensional fin 603a and below a second portion of the three-dimensional fin 603b.

The three-dimensional fins 602 are positioned between isolation regions 604a-604c having varying heights. The varying heights of the isolation regions 604a-604c provide for different distances $d_1$, $d_2$, etc. between a bottom of an adjacent isolation region 604 and an epitaxial enhancement structures 606. For example, a first three-dimensional fin 602a has an epitaxial enhancement structure 606 located at a first distance $d_1$ above a bottom of an adjacent isolation region 604a. A second three-dimensional fin 602b, adjacent to the first three-dimensional fin 602a, is located between a first isolation region 604a and a second isolation region 604b. The first isolation region 604a has a first height $h_1$ and the second isolation region 604b has a second height $h_2$. Since the second height $h_2$ is larger than the first height $h_1$, the second three-dimensional fin 604b has an epitaxial enhancement structure located at a second distance $d_2$ above a bottom of an adjacent isolation region 604, which is larger than the first distance $d_1$. Third and fourth three-dimensional fins, 602c and 602d, are also adjacent to isolation regions having varying heights, thereby providing for varying distance. In some embodiments, the varying heights of the isolation regions 604 form a concave curvature 608 that curves inward towards the epitaxial enhancement structures 606.

Figure 6B:
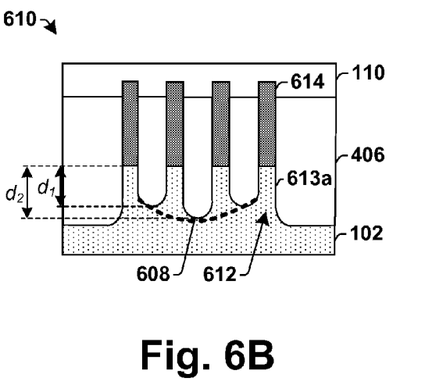

FIG. 6B illustrates some alternative embodiments of a cross-sectional view 610 of a FinFET device having epitaxial enhancement structures 614 disposed within three-dimensional fins 612 having varying distances. In cross-sectional view 610, the epitaxial enhancement structures 614 are located above a first portion of the three-dimensional fin 613a.

Figure 7A:
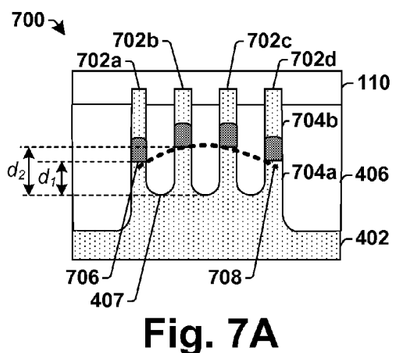

FIG. 7A illustrates some embodiments of a cross-sectional view 700 of a FinFET device having epitaxial enhancement structures 706 disposed within three-dimensional fins 702 at varying distances above a crown structure of a semiconductor substrate 402. The epitaxial enhancement structures 706 are located above a first portion of a three-dimensional fin 704a and below a second portion of the three-dimensional fin 704b.

The three-dimensional fins 702 are positioned between isolation regions 406 and 407. The epitaxial enhancement structures 706 are located at varying positions within the three-dimensional fins 702 that provide for different distances $d_1$, $d_2$, etc between a bottom of an adjacent isolation region 407 and an epitaxial enhancement structures 706. For example, a first three-dimensional fin 702a has an epitaxial enhancement structure 706 located at a first distance $d_1$ above a bottom of an adjacent isolation region 407, a second three-dimensional fin 702b has an epitaxial enhancement structure 706 located at a second distance $d_2$ above bottom of an adjacent isolation region 407, etc. In some embodiments, the varying positions of the epitaxial enhancement structures 706 form a convex curvature 708 that curves outward towards the top of the isolation regions 406 and 407.

Figure 7B:
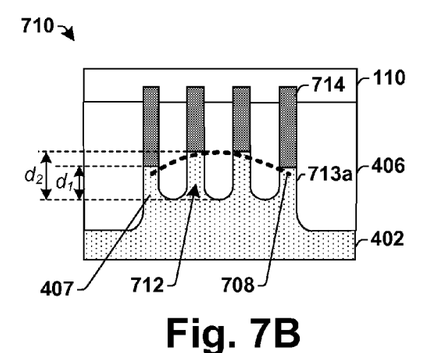

FIG. 7B illustrates some alternative embodiments of a cross-sectional view 710 of a FinFET device having buried epitaxial enhancement structures 714 disposed within three-dimensional fins 712 having varying distances. In cross-sectional view 710, the epitaxial enhancement structures 714 are located above a first portion of the three-dimensional fin 713a.

Figure 8A:
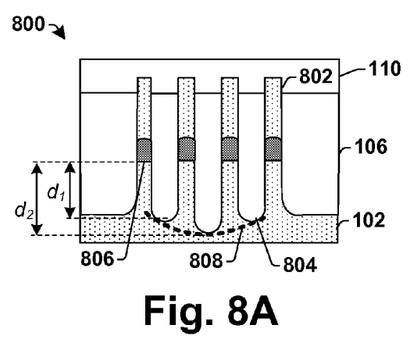
Figure 8B:
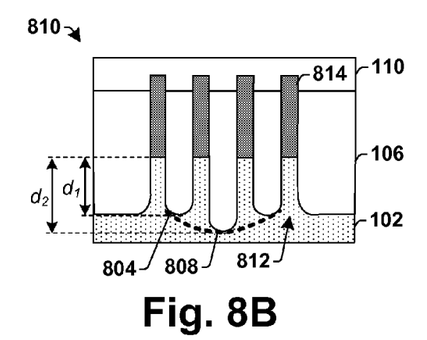

FIGS. 8A-8B illustrate cross-sectional views, 800 and 810, of some embodiments of a FinFET device having epitaxial enhancement structure, 806 and 814, disposed within three-dimensional fins, 802 and 812, at varying distances above a planar substrate 102. The epitaxial enhancement structures, 806 and 814, are located between isolation regions 808 having varying heights that cause the epitaxial enhancement structures, 806 and 814, to be located at different distances $d_1$, $d_2$, etc. above a bottom of an adjacent isolation regions 808.

Figure 9A:
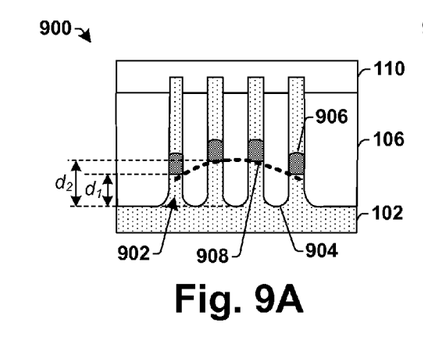
Figure 9B:
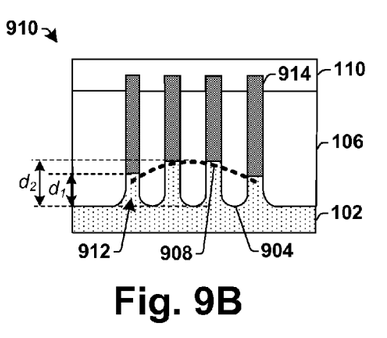

FIGS. 9A-9B illustrate cross-sectional views, 900 and 910, of some embodiments of a FinFET device having epitaxial enhancement structures, 906 and 914, disposed within three-dimensional fins, 902 and 912, at varying positions that cause the epitaxial enhancement structures, 906 and 914, to be located at different distances $d_1$, $d_2$, etc. above a bottom of an adjacent isolation region 904.

Figure 10:
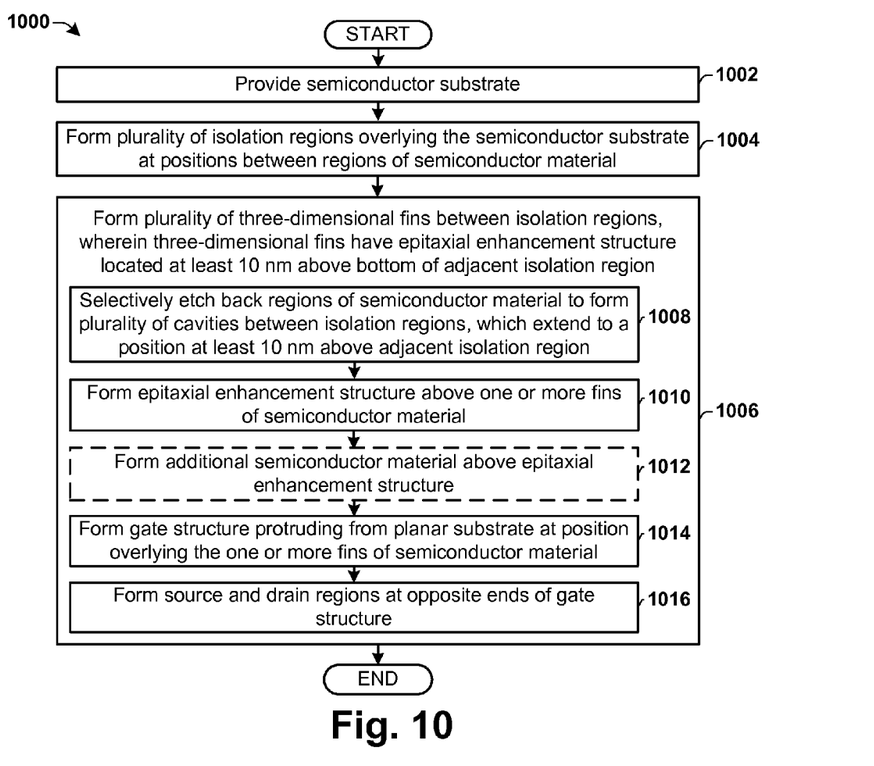
FIG. 10 illustrates a flow chart of some embodiments of a method of forming a FinFET device having an epitaxial enhancement structure.

FIG. 10 illustrates a flow chart of some embodiments of a method 1000 of forming a FinFET device having an epitaxial enhancement structure.

While the disclosed method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1002, a semiconductor substrate is provided. In various embodiments, the semiconductor substrate may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith. In some embodiments the semiconductor substrate may comprise a planar substrate. In other embodiments, the semiconductor substrate may comprise a crown structure, comprising a plateau of semiconductor material extending outward from a planar surface of the semiconductor substrate.

At 1004, a plurality of isolation regions are formed at positions overlying the semiconductor substrate. The resulting substrate comprises sections of semiconductor material that are separated by isolation regions, so that the isolation regions are interleaved between the sections of semiconductor material.

At 1006 a plurality of three-dimensional fins are formed between the plurality of isolation regions, wherein the plurality of three-dimensional fins comprise epitaxial enhancement structures within at positions that are more than 10 nanometers above a bottom of an adjacent isolation region. The epitaxial enhancement regions are configured to introduce a strain into the three-dimensional fins.

In some embodiments, the plurality of three-dimensional fins comprising epitaxial enhancement structures may be formed by acts 1008-1016.

At 1008, an etching procedure is performed to etch back one or more sections of semiconductor material to form plurality of cavities between isolation regions. The one or more sections of semiconductor material are etched back to a position that is greater than 10 nm above a highest adjacent isolation regions. In various embodiments, the plurality of cavities may be formed by a wet chemical etch and/or a dry chemical etch, which utilize an isotropic etch profile.

At 1010, epitaxial enhancement structures are formed within the plurality of cavities. In some embodiments, the epitaxial enhancement structures may comprise germanium (Ge). In other embodiments, the epitaxial enhancement structures may comprise silicon-germanium (SiGe). In yet other embodiments, the epitaxial enhancement structures may comprise other materials that induce a strain into a subsequently formed three-dimensional fin.

At 1012, an additional layer of semiconductor material may be formed over the epitaxial enhancement structures within the one or more three-dimensional fins. The additional layer of semiconductor material may be formed by way of a deposition technique (e.g., chemical vapor deposition, physical vapor deposition, etc.).

At 1014, a gate structure is formed at a position overlying the one or more three-dimensional fins. The gate structure straddles the three-dimensional fins. In some embodiments, the gate structure may comprise a gate dielectric layer and a gate material. In some embodiments, sidewalls spacers may be located on opposing sides of the gate structure.

In some embodiments, the gate structure may be formed using a metal gate replacement process, in which a dummy gate material is first formed onto the substrate at a position overlying the one or more fins of semiconductor material. The dummy gate material is removed after the formation of sidewall spacers, and a gate dielectric material and a gate material are formed in place of the removed dummy gate structure. In some embodiments, the gate dielectric layer may comprise a high-k dielectric layer such as hafnium oxide ($HfO_2$), $TiO_2$, HfZrO, $Ta_2O_3$, $HfSiO_4$, $ZrO_2$, $ZrSiO_2$, etc., formed by a deposition technique (e.g., atomic layer deposition (ALD)). In some embodiments, the gate material may comprise a metal (e.g., aluminum) formed using a deposition technique.

At 1016, source and drain regions are formed at opposite ends of the gate structure. In some embodiments, the source and drain regions are formed by selectively etching the three-dimensional fins to form source and drain recesses. Source regions and drain regions are then formed within the source recesses and the drain recesses, respectively. In some embodiments, the source and drain regions can be formed by a CDE process. In some embodiments, the source region and the drain region may comprise epitaxial material grown within the source and drain recesses.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a Fin field effect transistor (FinFET) device having epitaxial enhancement structures, and an associated method of fabrication In some embodiments, the present disclosure relates to a Fin field effect transistor (FinFET) device. The FinFET device comprises a semiconductor substrate. The FinFET device further comprises a plurality of isolation regions overlying the semiconductor substrate. The FinFET device further comprises a plurality of three-dimensional fins protruding from a top surface of the semiconductor substrate at locations between the plurality of isolation regions. Respective three-dimensional fins comprise an epitaxial enhancement structure disposed within the three-dimensional fin at a position that is more than 10 nanometers above a bottom of an adjacent isolation region.

In other embodiments, the present disclosure relates to a Fin field effect transistor (FinFET) device. The FinFET device comprises a semiconductor substrate. The FinFET device further comprises a plurality of isolation regions overlying the semiconductor substrate. The FinFET device further comprises a plurality of three-dimensional fins protruding from a planar substrate at locations between the plurality of isolation regions. The FinFET device further comprises a plurality of epitaxial enhancement structures disposed within the plurality of three-dimensional fins at a distance above a bottom of an adjacent isolation region that is more than 10% of a height of an adjacent isolation region, wherein the epitaxial enhancement structures are configured to introduce a strain into the three-dimensional fins.

In other embodiments, the present disclosure relates to a method of forming a FinFET device. The method comprises providing a semiconductor substrate. The method further comprises forming a plurality of isolation regions at positions overlying the semiconductor substrate. The method further comprises forming a plurality of three-dimensional fins protruding from a top surface of the semiconductor substrate at locations between the plurality of isolation regions. The method further comprises forming a plurality of epitaxial enhancement structures within the plurality of three-dimensional fins at positions that are more than 10 nanometers above a bottom of an adjacent isolation region, wherein the epitaxial enhancement structures are configured to introduce a strain into the three-dimensional fins.

What is claimed is:

1. A Fin field effect transistor (FinFET) device, comprising:
   a semiconductor substrate;
   a plurality of isolation regions overlying the semiconductor substrate;
   a plurality of three-dimensional fins protruding from a top surface of the semiconductor substrate at locations between the plurality of isolation regions, and respectively comprising an epitaxial enhancement structure disposed within a three-dimensional fin at a position that is laterally disposed between adjacent ones of the plurality of isolation regions and arranged vertically between a lower part of the three-dimensional fin that extends outward from the top surface of the semiconductor substrate and an upper part of the three-dimensional fin;
   wherein the semiconductor substrate comprises a crown structure, which protrudes outward from the semiconductor substrate as a plateau disposed below the plurality of three-dimensional fins, and that has sidewalls laterally aligned with a sidewall of one or more of the plurality of three-dimensional fins;
   a source region and a drain region arranged on opposing sides of a gate region overlying the plurality of three-dimensional fins; and
   wherein the lower part has a lower surface in contact with the semiconductor substrate and the upper part has an upper surface in contact with lower surfaces of the source region and the drain region along an interface that is below an upper surface of the plurality of isolation regions.

2. The FinFET device of claim 1, wherein the plurality of three-dimensional fins comprise silicon and the epitaxial enhancement structure comprises silicon-germanium or germanium.

3. The FinFET device of claim 1, wherein the plurality of isolation regions have a substantially equal height.

4. The FinFET device of claim 1, wherein isolation regions disposed over the crown structure have a smaller height than isolation regions not disposed over the crown structure.

5. The FinFET device of claim 4, wherein the epitaxial enhancement structure is located at a distance having a range of approximately 10 nm to approximately 40 nm above the semiconductor substrate.

6. The FinFET device of claim 1, wherein the epitaxial enhancement structure is disposed within the three-dimensional fin at a distance above the semiconductor substrate that is between approximately 8% and approximately 66% of a height of an adjacent isolation region.

7. The FinFET device of claim 1, further comprising:
   source and drain regions located vertically over the epitaxial enhancement structure and having lowers surface abutting an upper surface of the upper part of the three-dimensional fin.

8. The FinFET device of claim 1,
   wherein the lower part and the upper part of the three-dimensional fins are a same material that is different than a material of the epitaxial enhancement structure; and
   wherein the lower part of the three-dimensional fin contacts the semiconductor substrate and the upper part of the three-dimensional fin contacts an overlying a gate dielectric layer.

9. The FinFET device of claim 1, wherein the plurality of isolation regions vertically extend to positions below an upper surface of the upper part of the three-dimensional fin underneath a gate structure and vertically extend to positions above the upper surface at areas laterally offset from the gate structure.

10. A Fin field effect transistor (FinFET) device, comprising:
    a semiconductor substrate;
    a plurality of isolation regions overlying the semiconductor substrate;
    a plurality of three-dimensional fins protruding from the semiconductor substrate to locations vertically extending between sidewalls of the plurality of isolation regions;
    a plurality of epitaxial enhancement structures disposed within the plurality of three-dimensional fins at a distance above a bottom of an adjacent isolation region that is more than 10% of a height of an adjacent isolation region, wherein the plurality of epitaxial enhancement structures are configured to introduce a strain into the three-dimensional fins, and wherein the plurality of epitaxial enhancement structures are arranged vertically between lower parts of the three-dimensional fins contacting the semiconductor substrate and upper parts of the three-dimensional fins vertically contacting an overlying gate dielectric layer, and have outermost sidewalls that are aligned with outermost sidewalls of the lower parts and upper parts; and
    source regions and drain regions arranged on opposing sides of a gate region overlying the plurality of three-dimensional fins, wherein the lower parts have lower surfaces in contact with the semiconductor substrate and the upper parts have upper surfaces in contact with lower surfaces of the source regions and the drain regions along an interface that is below an upper surface of the plurality of isolation regions;
    wherein the lower parts and the upper parts of the three-dimensional fins are a same material that is different than a material of the plurality of epitaxial enhancement structures.

11. The FinFET device of claim 10, wherein the plurality of three-dimensional fins comprise silicon and the plurality of epitaxial enhancement structures comprise silicon-germanium or germanium.

12. The FinFET device of claim 10, wherein the plurality of epitaxial enhancement structures are located at a distance having a range of approximately 10 nm to approximately 80 nm above the semiconductor substrate.

13. The FinFET device of claim 10,
    wherein the semiconductor substrate comprises a crown structure, which protrudes outward from the semiconductor substrate as a plateau, disposed below the plurality of three-dimensional fins and having sidewalls that are aligned with sidewalls of one or more of the plurality of three-dimensional fins, wherein isolation regions disposed over the crown structure have a smaller height than isolation regions not disposed over the crown structure.

14. The FinFET device of claim 10, wherein the plurality of three-dimensional fins respectively comprise a lower portion of semiconductor material underlying the plurality of epitaxial enhancement structures and an upper portion of semiconductor material overlying the plurality of epitaxial enhancement structures.

15. The FinFET of claim 10, wherein the semiconductor substrate comprises a crown structure, which protrudes outward from the semiconductor substrate as a plateau disposed below the plurality of three-dimensional fins; and wherein the crown structure comprises a first outermost sidewall contacting a first one of the plurality of isolation regions and laterally aligned with an outermost sidewall of a first one of the plurality of three-dimensional fins, and a second outermost sidewall contacting a second one of the plurality of isolation regions and laterally aligned with an outermost sidewall of a second one of the plurality of three-dimensional fins.

16. A method of forming a FinFET device, comprising:

providing a semiconductor substrate;

forming a plurality of isolation regions at positions overlying the semiconductor substrate;

forming a plurality of three-dimensional fins protruding from a top surface of the semiconductor substrate to locations vertically extending between sidewalls of the plurality of isolation regions;

forming a plurality of epitaxial enhancement structures within the plurality of three-dimensional fins above a bottom of an adjacent isolation region and at positions arranged vertically between lower parts of the three-dimensional fins contacting the semiconductor substrate and upper parts of the three-dimensional fins vertically contacting an overlying gate dielectric layer, wherein the epitaxial enhancement structures have outermost sidewalls that are aligned with outermost sidewalls of the lower parts and upper parts of the three-dimensional fins and are configured to introduce a strain into the three-dimensional fins; and forming source regions and drain regions on opposing sides of a gate region overlying the plurality of three-dimensional fins, wherein the lower parts have lower surfaces in contact with the semiconductor substrate and the upper parts have upper surfaces in contact with lower surfaces of the source regions and the drain regions along an interface that is below upper surfaces of the plurality of isolation regions;

wherein the lower parts and the upper parts of the three-dimensional fins are a same material that is different than a material of the plurality of epitaxial enhancement structures.

17. The method of claim 16, wherein the plurality of epitaxial enhancement structures comprise silicon-germanium or germanium and the lower parts and upper parts of the three-dimensional fins are silicon.

18. The method of claim 16, wherein the plurality of epitaxial enhancement structures are disposed within the plurality of three-dimensional fins at a distance above the semiconductor substrate that is between approximately 8% and approximately 66% of a height of an adjacent isolation region.

19. The method of claim 16, wherein the semiconductor substrate comprises a crown structure that protrudes outward from the semiconductor substrate as a plateau disposed below the plurality of three-dimensional fins; and wherein the crown structure comprises a first outermost sidewall contacting a first one of the plurality of isolation regions and laterally aligned with an outermost sidewall of a first one of the plurality of three-dimensional fins, and a second outermost sidewall contacting a second one of the plurality of isolation regions and laterally aligned with an outermost sidewall of a second one of the plurality of three-dimensional fins.

* * * * *